(12) United States Patent
Sugawara et al.

(10) Patent No.: US 11,189,778 B2
(45) Date of Patent: Nov. 30, 2021

(54) ELEMENT, CELL, AND POWER GENERATION DEVICE

(71) Applicant: Ricoh Company, Ltd., Tokyo (JP)

(72) Inventors: Tomoaki Sugawara, Kanagawa (JP); Tsuneaki Kondoh, Kanagawa (JP); Yuko Arizumi, Kanagawa (JP); Junichiro Natori, Kanagawa (JP); Mizuki Otagiri, Kanagawa (JP); Mayuka Araumi, Tokyo (JP); Megumi Kitamura, Tokyo (JP); Takahiro Imai, Tokyo (JP); Makito Nakashima, Kanagawa (JP); Hideyuki Miyazawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 480 days.

(21) Appl. No.: 16/080,993

(22) PCT Filed: Nov. 29, 2016

(86) PCT No.: PCT/JP2016/085401
§ 371 (c)(1),
(2) Date: Aug. 29, 2018

(87) PCT Pub. No.: WO2017/154286
PCT Pub. Date: Sep. 14, 2017

(65) Prior Publication Data
US 2019/0103548 A1    Apr. 4, 2019

(30) Foreign Application Priority Data
Mar. 7, 2016 (JP) .............................. JP2016-043657

(51) Int. Cl.
*H01L 41/113* (2006.01)
*H01L 41/193* (2006.01)
(Continued)

(52) U.S. Cl.
CPC .......... *H01L 41/113* (2013.01); *H01L 41/047* (2013.01); *H01L 41/083* (2013.01); *H01L 41/193* (2013.01); *H02N 1/04* (2013.01)

(58) Field of Classification Search
CPC ... H01L 41/113; H01L 41/047; H01L 41/083; H01L 41/193; H01L 23/532;
(Continued)

(56) References Cited

U.S. PATENT DOCUMENTS 5,376,590 A * 12/1994 Machida ........... H01L 21/02274
438/763
9,496,505 B2 * 11/2016 Nowatari ............ H01L 51/0073
(Continued)

FOREIGN PATENT DOCUMENTS

CN    103354429 A    10/2013
CN    103368453 A    10/2013
(Continued)

OTHER PUBLICATIONS

JP-2014027756—A machine translation on Apr. 16, 2021.*
(Continued)

*Primary Examiner* — Tran N Nguyen
*Assistant Examiner* — Leda T Pham
(74) *Attorney, Agent, or Firm* — Xsensus LLP

(57) ABSTRACT

An element 1 includes a pair of electrodes 2 and 3, and an intermediate layer 4 having deformability, arranged between the pair of electrodes 2 and 3, and containing, as a material, a silicon compound including an unpaired electron. The intermediate layer 4 may contain a particle including the unpaired electron. The intermediate layer 4 may have rubber elasticity. The intermediate layer 4 may have at least one peak at a g value between 2.070 and 2.001 when being measured at an environment temperature of −150° C. by using an electron spin resonance (ESR) device. The inter-
(Continued)

mediate layer 4 may have at least one peak at a g value between 2.070 and 2.001 when being measured at an environment temperature of −150° C. by using the electron spin resonance (ESR) device.

10 Claims, 11 Drawing Sheets

(51) Int. Cl.
 *H02N 1/04* (2006.01)
 *H01L 41/047* (2006.01)
 *H01L 41/083* (2006.01)
(58) Field of Classification Search
 CPC ... H01L 21/316; H01L 21/02; H01L 21/3105; H01L 23/52; H01L 21/70; H01L 21/768
 See application file for complete search history.

(56) References Cited

U.S. PATENT DOCUMENTS

| | | | |
|---|---|---|---|
| 2003/0115966 A1 | 6/2003 | Ueno et al. | |
| 2012/0061676 A1* | 3/2012 | Egi | H01L 29/78648 257/60 |
| 2013/0257156 A1* | 10/2013 | Hadimani | H01L 27/304 307/48 |
| 2015/0344671 A1* | 12/2015 | Furukawa | C08K 5/5475 310/366 |
| 2016/0088696 A1 | 3/2016 | Kizaki et al. | |
| 2016/0088706 A1 | 3/2016 | Kizaki et al. | |
| 2018/0013057 A1 | 1/2018 | Arizumi et al. | |
| 2018/0054141 A1 | 2/2018 | Natori et al. | |
| 2018/0308989 A1* | 10/2018 | Yamazaki | H01L 29/7869 |

FOREIGN PATENT DOCUMENTS

| | | | | |
|---|---|---|---|---|
| CN | 104135186 A | 11/2014 | | |
| CN | 104283453 A | 1/2015 | | |
| CN | 104426414 A | 3/2015 | | |
| CN | 104981518 A | 10/2015 | | |
| EP | 2 975 758 A1 | 1/2016 | | |
| EP | 2 975 759 A1 | 1/2016 | | |
| EP | 3 021 476 A1 | 5/2016 | | |
| JP | 2002-075987 | 3/2002 | | |
| JP | 2004-120809 | 4/2004 | | |
| JP | 3694740 | 7/2005 | | |
| JP | 2006278583 A | * 10/2006 | | |
| JP | 2009-232677 | 10/2009 | | |
| JP | 2011-049073 | 3/2011 | | |
| JP | 2014-27756 A | 2/2014 | | |
| JP | 2014027756 A | * 2/2014 | ............... | H02N 1/08 |
| JP | 2014-220949 | 11/2014 | | |
| JP | 5699641 | 2/2015 | | |
| JP | 2015-122922 | 7/2015 | | |
| JP | 2015-198154 | 11/2015 | | |
| KR | 10-2015-0102085 A | 9/2015 | | |
| WO | WO 2013/157643 A1 | 10/2013 | | |
| WO | WO 2014/105959 A1 | 7/2014 | | |
| WO | WO 2016/117285 A1 | 7/2016 | | |
| WO | WO 2016/143251 A1 | 9/2016 | | |

OTHER PUBLICATIONS

JP-2006278583—A machine translation on Apr. 16, 2021.*
Office Action dated Jul. 30, 2019 in Japanese Patent Application No. 2018-504001.
International Search Report dated Feb. 7, 2017 in PCT/JP2016/085401 filed Nov. 29, 2016.
Keisuke Iwata, et al. "Influences of Electron Beam Irradiation on Impact Value for Silica Glass", J. Japan Inst. Metals, vol. 70, No. 10, The Japan Institute of Metals, 2006, pp. 840-844.
Hironori Sato, et al. "Rapid Joining between Different Polymers Homogeneously Irradiated by Electron Beam", J. Japan Inst. Metals, vol. 72, No. 7, The Japan Institute of Metals, 2008, pp. 526-531.
Office Action dated Dec. 9, 2019 in European Patent Application No. 16893610.2, 4 pages.
Extended European Search Report dated Jan. 30, 2019 in corresponding European Patent Application No. 16893610.2, 7 pages.
Combined Office Action and Search Report dated Apr. 16, 2019 in Chinese Patent Application No. 201680083253.7 (with English translation), 15 pages.
Office Action dated Sep. 30, 2019 in Korean Patent Application No. 10-2018-7024752, 10 pages (with English translation).
Perlman, M.M. et al. "Silicone resin electrets" Journal of Applied Physics, vol. 50, No. 5, 1979, 7 pages.

* cited by examiner

THICKNESS DIRECTION
(DEPTH DIRECTION)

ELEMENT, CELL, AND POWER GENERATION DEVICE

FIELD

The present invention relates to an element, a cell, and a power generation device.

BACKGROUND

In the related art, developed is a technique of converting vibration energy into electric energy to be effectively utilized, the vibration energy caused by vibration of a structure such as a road, a bridge, and a building, vibration of a mobile object such as an automobile and a railway vehicle, vibration caused by motion of a person, and wave power or wind power.

As an example of such a technique, disclosed is a piezoelectric element from which electricity can be taken out with relatively small external force by rubbing a surface thereof with a finger and the like (for example, refer to Patent Literatures 1 to 4).

This piezoelectric element utilizes a phenomenon such that, when distortion is applied to the piezoelectric element by external force such as vibration, for example, an electric charge is induced on the surface of the piezoelectric element.

SUMMARY

Technical Problem

However, a conventional piezoelectric element is hard itself, and requires a rigid structure to efficiently transmitting power to the element.

The present invention is made in view of such a situation, and a main object of the invention is to provide a new element having deformability that converts external force into electric energy.

Solution to Problem

In order to achieve the above-described object, an element according to the present invention includes: a pair of electrodes; and an intermediate layer having deformability, arranged between the pair of electrodes, and containing, as a material, a silicon compound including an unpaired electron.

Advantageous Effects of Invention

The present invention can provide a new element having deformability for converting external force into electric energy.

DESCRIPTION OF EMBODIMENTS

The following describes embodiments of the present invention with reference to the drawings. FIG. 1 to FIG. 6 illustrate a first embodiment.

Outline

Figure 1:
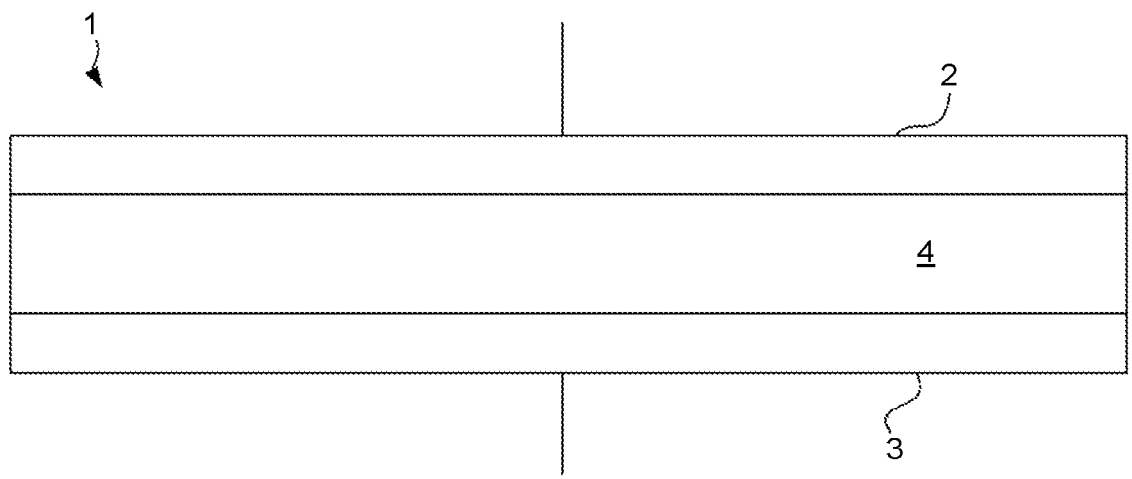
FIG. 1 is a view illustrating a power generation element according to a first example of the present invention.

FIG. 1 is a schematic cross sectional view of an element according to the present embodiment. An element 1 includes a first electrode 2 and a second electrode 3 opposed to each other, and an intermediate layer 4 that is arranged between the first and the second electrodes 2 and 3 and is made of rubber or a rubber composition.

Details

First Electrode and Second Electrode

A material, a shape, a size, and a structure of the first electrode 2 and the second electrode 3 are not limited, and can be appropriately selected in accordance with a purpose.

The material, the shape, the size, and the structure of the first electrode 2 and the second electrode 3 may be the same or different from each other, but are preferably the same.

Examples of the material of the first electrode 2 and the second electrode 3 include metal, a carbon-based conductive material, a conductive rubber composition, a conductive polymer, and an oxide.

Examples of the metal include gold, silver, copper, aluminum, stainless steel, tantalum, nickel, and phosphor bronze. Examples of the carbon-based conductive material include a carbon nanotube, a carbon fiber, and graphite. Examples of the conductive rubber composition include a composition containing a conductive filler and rubber. Examples of the conductive polymer include polyethylene dioxythiophene (PEDOT), polypyrrole, and polyaniline. Examples of the oxide include an indium tin oxide (ITO), an indium oxide-zinc oxide (IZO), and a zinc oxide.

Examples of the conductive filler include a carbon material (for example, Ketjen black, acetylene black, graphite, a carbon fiber, a carbon fiber (CF), a carbon nanofiber (CNF), a carbon nanotube (CNT), and graphene), a metal filler (gold, silver, platinum, copper, aluminum, and nickel), a conductive polymeric material (a derivative of any of polythiophene, polyacetylene, polyaniline, polypyrrole, polyparaphenylene, and polyparaphenylene vinylene, or the derivative to which a dopant represented by an anion or a cation is added), and ion liquid. One type of them may be singly used, or two or more types of them may be used together.

Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone. One type of them may be singly used, or two or more types of them may be used together.

Examples of the shape of the first electrode 2 and the shape of the second electrode 3 include a thin film. Examples of the structure of the first electrode 2 and the structure of the second electrode 3 may include a textile, nonwoven fabric, a knit, a mesh, a sponge, and nonwoven fabric formed by overlapping fibrous carbon materials.

An average thickness of the electrode is not limited, and can be appropriately selected in accordance with a purpose. In view of conductivity and flexibility, the average thickness of the electrode is preferably 0.01 µm to 1 mm, and more preferably 0.1 µm to 500 µm. When the average thickness is equal to or larger than 0.01 µm, mechanical strength is correct, and the conductivity is improved. When the average thickness is equal to or smaller than 1 mm, the element is deformable, and power generation performance is favorable.

Intermediate Layer

The intermediate layer 4 has flexibility.

The intermediate layer 4 satisfies at least one of the following condition (1) and condition (2). Condition (1): When the intermediate layer 4 is pressurized from a direction orthogonal to the surface of the intermediate layer 4, a deformation amount on the first electrode 2 side (one side) of the intermediate layer 4 is different from a deformation amount on the second electrode 3 side (the other side) of the intermediate layer 4.

Condition (2): Universal hardness (H1) at the time of 10 µm pushing on the first electrode 2 side of the intermediate layer 4 is different from universal hardness (H2) at the time of 10 µm pushing on the second electrode 3 side of the intermediate layer 4.

With the intermediate layer 4, as described above, the deformation amount or the hardness is different between both surfaces, so that a large power generation amount can be obtained.

In the present invention, the deformation amount is the maximum pushing depth of an indenter at the time when the intermediate layer 4 is pushed against the indenter under the following conditions.

Measurement Condition

Measuring machine: Micro hardness meter WIN-HUD manufactured by Fischer Instruments K.K.

Indenter: Quadrangular pyramid diamond indenter having facing angle of 136°

Initial load: 0.02 mN

Maximum load: 1 mN

Load increasing time from initial load to maximum load: 10 seconds

The universal hardness is obtained by using the following method.

Measurement Condition

Measuring machine: Micro hardness meter WIN-HUD manufactured by Fischer Instruments K.K.

Indenter: Quadrangular pyramid diamond indenter having facing angle of 136°

Pushing depth: 10 µm

Initial load: 0.02 mN

Maximum load: 100 mN

Load increasing time from initial load to maximum load: 50 seconds

A ratio between the universal hardness (H1) and the universal hardness (H2) (H1/H2) is preferably equal to or larger than 1.01, more preferably equal to or larger than 1.07, and especially preferably equal to or larger than 1.13. An upper limit value of the ratio (H1/H2) is not limited, and appropriately selected based on a degree of flexibility required in a use state, and a load in the use state, for example. The upper limit value of the ratio (H1/H2) is preferably equal to or smaller than 1.70. Herein, H1 is the universal hardness of a relatively hard surface, and H2 is the universal hardness of a relatively soft surface.

The material of the intermediate layer 4 is not limited, and can be appropriately selected in accordance with a purpose. For example, rubber or a rubber composition may be used as the material of the intermediate layer 4. Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone. One type of them may be singly used, or two or more types of them may be used together. Among these, the silicone rubber is preferred.

The silicone rubber is not limited so long as the silicone rubber has a siloxane bond, and can be appropriately selected in accordance with a purpose. Examples of the silicone rubber include dimethyl silicone rubber, methylphenyl silicone rubber, fluorosilicone rubber, and modified silicone rubber (for example, acrylic-modified, alkyd-modified, ester-modified, and epoxy-modified). One type of them may be singly used, or two or more types of them may be used together.

Examples of the rubber composition include a composition containing a filler and the rubber. Among these, a silicone rubber composition containing the silicone rubber is preferable because power generation performance is high.

Examples of the filler include an organic filler, an inorganic filler, and an organic-inorganic composite filler. The organic filler is not limited so long as the organic filler is an organic compound, and can be appropriately selected in accordance with a purpose. Examples of the organic filler include an acrylic fine particle, a polystyrene fine particle, a melamine fine particle, a fluororesin fine particle such as polytetrafluoroethylene, silicone powder (silicone resin powder, silicone rubber powder, and silicone composite powder), rubber powder, wood flour, pulp, and starch. The inorganic filler is not limited so long as the inorganic filler is an inorganic compound, and can be appropriately selected in accordance with a purpose.

Examples of the inorganic filler include an oxide, a hydroxide, a carbonate, a sulfate, a silicate, a nitride, carbons, metal, or other compounds.

Examples of the oxide include silica, diatomaceous earth, alumina, a zinc oxide, a titanium oxide, an iron oxide, and a magnesium oxide.

Examples of the hydroxide include an aluminum hydroxide, a calcium hydroxide, and a magnesium hydroxide.

Examples of the carbonate include a calcium carbonate, a magnesium carbonate, a barium carbonate, and hydrotalcite.

Examples of the sulfate include an aluminum sulfate, a calcium sulfate, and a barium sulfate.

Examples of the silicate include a calcium silicate (wollastonite, zonotlite), a zircon silicate, kaolin, talc, mica, zeolite, perlite, bentonite, montmorillonite, sericite, activated clay, glass, and hollow glass beads.

Examples of the nitride include an aluminum nitride, a silicon nitride, and a boron nitride.

Examples of the carbons include Ketjen black, acetylene black, graphite, a carbon fiber, a carbon fiber, a carbon nanofiber, a carbon nanotube, a fullerene (including a derivative), and graphene.

Examples of the metal include gold, silver, platinum, copper, iron, aluminum, and nickel.

Examples of the other compounds include a potassium titanate, a barium titanate, a strontium titanate, a lead zirconate titanate, a silicon carbide, and a molybdenum sulfide. The inorganic filler may be surface-treated.

The organic-inorganic composite filler is not limited so long as the organic-inorganic composite filler is a compound combining an organic compound and an inorganic compound at a molecular level.

Examples of the organic-inorganic composite filler include a silica-acrylic composite fine particle and silsesquioxane.

An average particle diameter of the filler is not limited, and can be appropriately selected in accordance with a purpose. The average particle diameter of the filler is preferably 0.01 μm to 30 μm, and more preferably 0.1 μm to 10 μm. When the average particle diameter is equal to or larger than 0.01 μm, power generation performance is improved in some cases. When the average particle diameter is equal to or smaller than 30 μm, the intermediate layer 4 is deformable, and power generation performance can be attempted to be increased.

The average particle diameter can be measured in accordance with a known method by using a known particle size distribution measuring device, for example, Microtrac HRA (manufactured by Nikkiso Co., Ltd.).

Content of the filler is preferably 0.1 pts·mass to 100 pts·mass, and more preferably 1 pts·mass to 50 pts·mass, with respect to 100 pts·mass of rubber. When the content is equal to or larger than 0.1 pts·mass, power generation performance is improved in some cases. When the content is equal to or smaller than 100 pts·mass, the intermediate layer 4 is deformable, and the power generation performance can be attempted to be increased.

The other components are not limited, and can be appropriately selected in accordance with a purpose. Examples of the other components include an additive. Content of the other components can be appropriately selected without departing from the purpose of the present invention.

Examples of the additive include a cross-linker, a reaction control agent, a filling material, a reinforcing member, an antioxidant, a conductivity control agent, a colorant, a plasticizer, a processing aid, a flame retardant, an ultraviolet absorber, a tackifier, and a thixotropy imparting agent.

A method of preparing the material constituting the intermediate layer 4 is not limited, and can be appropriately selected in accordance with a purpose. For example, as the method of preparing the rubber composition, the rubber composition can be prepared by mixing the rubber and the filler, and additionally mixing the other components as needed to be kneaded and dispersed.

A method of forming the intermediate layer 4 is not limited, and can be appropriately selected in accordance with a purpose. For example, as the method of forming a thin film of the rubber composition, exemplified is a method of applying the rubber composition onto a base material by blade coating, dye coating, dip coating, and the like, and curing the rubber composition with heat or an electron beam thereafter.

An average thickness of the intermediate layer 4 is not limited, and can be appropriately selected in accordance with a purpose. In view of a deformation following property, the average thickness of the intermediate layer 4 is preferably 1 μm to 10 mm, and more preferably 20 μm to 1 mm. When the average thickness falls within a preferable range, the film formability can be secured and deformation is not inhibited, so that favorable power generation can be performed.

The intermediate layer 4 preferably has an insulation property. As the insulation property, the intermediate layer 4 preferably has volume resistivity equal to or larger than $10^8$ Ωcm, and more preferably has the volume resistivity equal to or larger than $10^{10}$ Ωcm. The intermediate layer 4 may have a multilayered structure.

Surface Modification Treatment and Deactivation Treatment

As a method of causing the deformation amount or the hardness to be different between both surfaces of the intermediate layer 4, for example, surface modification treatment and deactivation treatment are exemplified. Both pieces of treatment may be performed, or only one of them may be performed.

Surface Modification Treatment

Examples of the surface modification treatment include plasma treatment, corona discharge treatment, electron beam irradiation treatment, ultraviolet irradiation treatment, ozonization, radiation (X ray, α ray, β ray, γ ray, and neutron ray) irradiation treatment. Among these pieces of treatment, in view of a treating speed, the plasma treatment, the corona discharge treatment, and the electron beam irradiation treatment are preferred. However, the embodiment is not limited thereto so long as the treatment has a certain degree of irradiation energy and can modify the material.

Plasma Treatment

In a case of the plasma treatment, a plasma generation device may be an atmospheric pressure plasma device in addition to a parallel flat plate type, a capacitive coupling type, and an inductive coupling type, for example. In view of durability, reduced pressure plasma treatment is preferred.

A reaction pressure in the plasma treatment is not limited, and can be appropriately selected in accordance with a purpose. The reaction pressure is preferably 0.05 Pa to 100 Pa, and more preferably 1 Pa to 20 Pa.

A reaction atmosphere in the plasma treatment is not limited, and can be appropriately selected in accordance with a purpose. As the reaction atmosphere, for example, gas such as an inert gas, a rare gas, and oxygen is effective. In view of persistence of effect, argon is preferred.

In this case, an oxygen partial pressure is preferably equal to or smaller than 5,000 ppm. When the oxygen partial pressure in the reaction atmosphere is equal to or smaller than 5,000 ppm, ozone can be prevented from being generated, and use of an ozone treatment device can be avoided.

An amount of irradiation power in the plasma treatment is defined by (output×irradiation time). The amount of irradiation power is preferably 5 Wh to 200 Wh, more preferably 10 Wh to 50 Wh. When the amount of irradiation power falls within a preferable range, a power generation function can be added to the intermediate layer 4, and durability is not deteriorated due to excessive irradiation.

Corona Discharge Treatment

Application energy (integrated energy) in the corona discharge treatment is preferably 6 J/cm$^2$ to 300 J/cm$^2$, more preferably 12 J/cm$^2$ to 60 J/cm$^2$. When the application energy falls within the preferable range, the power generation function can be added to the intermediate layer 4, and the durability is not deteriorated due to excessive irradiation.

Electron Beam Irradiation Treatment

An irradiation amount in the electron beam irradiation treatment is preferably equal to or larger than 1 kGy, more preferably 300 kGy to 10 MGy. When the irradiation amount falls within the preferable range, the power generation function can be added to the intermediate layer 4, and the durability is not deteriorated due to excessive irradiation.

The reaction atmosphere in the electron beam irradiation treatment is not limited, and can be appropriately selected in accordance with a purpose. It is preferable that the inert gas such as argon, neon, helium, and nitrogen is filled, and the oxygen partial pressure becomes equal to or smaller than 5,000 ppm. When the oxygen partial pressure in the reaction atmosphere is equal to or smaller than 5,000 ppm, ozone can be prevented from being generated, and use of the ozone treatment device can be avoided.

Ultraviolet Irradiation Treatment

Ultraviolet rays in the ultraviolet irradiation treatment preferably have a wavelength equal to or smaller than 365 nm and equal to or larger than 200 nm, more preferably have a wavelength equal to or smaller than 320 nm and equal to or larger than 240 nm.

An integrated amount of light in the ultraviolet irradiation treatment is preferably 5 J/cm$^2$ to 500 J/cm$^2$, more preferably 50 J/cm$^2$ to 400 J/cm$^2$. When the integrated amount of light falls within a preferable range, the power generation function can be added to the intermediate layer 4, and the durability is not deteriorated due to excessive irradiation.

The reaction atmosphere in the ultraviolet irradiation treatment is not limited, and can be appropriately selected in accordance with a purpose. It is preferable that the inert gas such as argon, neon, helium, and nitrogen is filled, and the oxygen partial pressure becomes equal to or smaller than 5,000 ppm. When the oxygen partial pressure in the reaction atmosphere is equal to or smaller than 5,000 ppm, ozone can be prevented from being generated, and use of the ozone treatment device can be avoided.

In the related art, developed is a technique of forming an active group by being excited or oxidized by the plasma treatment, the corona discharge treatment, the ultraviolet irradiation treatment, the electron beam irradiation treatment, and the like, and enhancing interlayer adhesive strength. However, the technique is only applied to an interlayer, and it has been found that it is not preferable to apply the technique to an outermost surface because a mold release property is deteriorated. The reaction is performed in an oxygen-rich state, and a reaction active group (hydroxyl group) is effectively introduced. Thus, essence of such related art is different from that of the surface modification treatment according to the present invention.

The surface modification treatment according to the present invention is treatment in a reaction environment in which an oxygen amount is small and the pressure is reduced (for example, plasma treatment), so that re-crosslinking and binding are promoted on the surface, for example, and the durability is improved due to "increase of Si—O binding having high binding energy".

Additionally, the mold release property is considered to be improved due to "densification caused by improvement in crosslink density". Some active groups are formed in the present invention, but the active group is deactivated using a coupling agent or air-drying processing described later.

Deactivation Treatment

Deactivation treatment may be appropriately performed on the surface of the intermediate layer 4 using various materials.

The deactivation treatment is not limited, and can be appropriately selected in accordance with a purpose so long as the treatment causes the surface of the intermediate layer 4 to be deactivated. For example, the deactivation treatment may be treatment of adding a deactivator to the surface of the intermediate layer 4. Deactivation means to cause the surface of the intermediate layer 4 to be changed to have a property of hardly causing a chemical reaction. This change can be achieved by causing the deactivator to react with the active group (for example, —OH) generated by excitation or oxidization through the plasma treatment, the corona discharge treatment, the ultraviolet irradiation treatment, and the electron beam irradiation treatment, and lowering activity of the surface of the intermediate layer 4.

Examples of the deactivator include an amorphous resin and a coupling agent. Examples of the amorphous resin include a resin having a perfluoropolyether structure in a main chain.

Examples of the coupling agent include a metal alkoxide and a solution containing the metal alkoxide.

Examples of the metal alkoxide include a compound represented by the following general expression (1), a partial hydrolysis polycondensate thereof having a degree of polymerization of about 2 to 10, or a mixture thereof.

$$R^1_{(4-n)}Si(OR^2)_n \qquad \text{general expression (1)}$$

In the general expression (1), $R^1$ and $R^2$ independently represent any of a straight-chain or branched alkyl group having a carbon number of 1 to 10, an alkyl polyether chain, and an aryl group.

Herein, n represents an integral number from 2 to 4.

For example, the deactivation treatment can be performed by performing the surface modification treatment on an intermediate layer precursor such as rubber, and applying a deactivator to the surface of the intermediate layer precursor or impregnating the surface thereof with the deactivator by dipping and the like.

In a case of using silicone rubber as the intermediate layer precursor, the silicone rubber may be deactivated by being caused to stand in the air to be air-dried after the surface modification treatment is performed thereon.

A profile of oxygen concentration in the thickness direction of the intermediate layer 4 preferably has a local maximum value. A profile of carbon concentration in the thickness direction of the intermediate layer 4 preferably has a local minimum value.

In the intermediate layer 4, a position where the profile of oxygen concentration indicates the local maximum value preferably matches the position where the profile of carbon concentration indicates the local minimum value.

The profile of oxygen concentration and the profile of carbon concentration can be obtained by using an X-ray photoelectron spectroscopic analysis method (XPS).

Examples of a measuring method include the following method.

Measuring Method

Measuring device: Ulvac-PHI QuanteraSXM, manufactured by ULVAC-PHI, Inc.

Measurement light source: Al (mono)

Measurement output: 100 μmφ, 25.1 W

Measurement region: 500 μm×300 μm

Path energy: 55 eV (narrow scan)

Energy step: 0.1 eV (narrow scan)

Relative sensitivity coefficient: Relative sensitivity coefficient of PHI is used Sputtering source: C60 cluster ion Ion Gun output: 10 kV, 10 nA Raster Control: (X=0.5, Y=2.0) mm Sputtering rate: 0.9 nm/min ($SiO_2$ conversion)

In the XPS, by capturing an electron jumping out due to a photoelectron effect, an atomic concentration and a binding state of atoms in a measuring object can be found.

Figure 2:
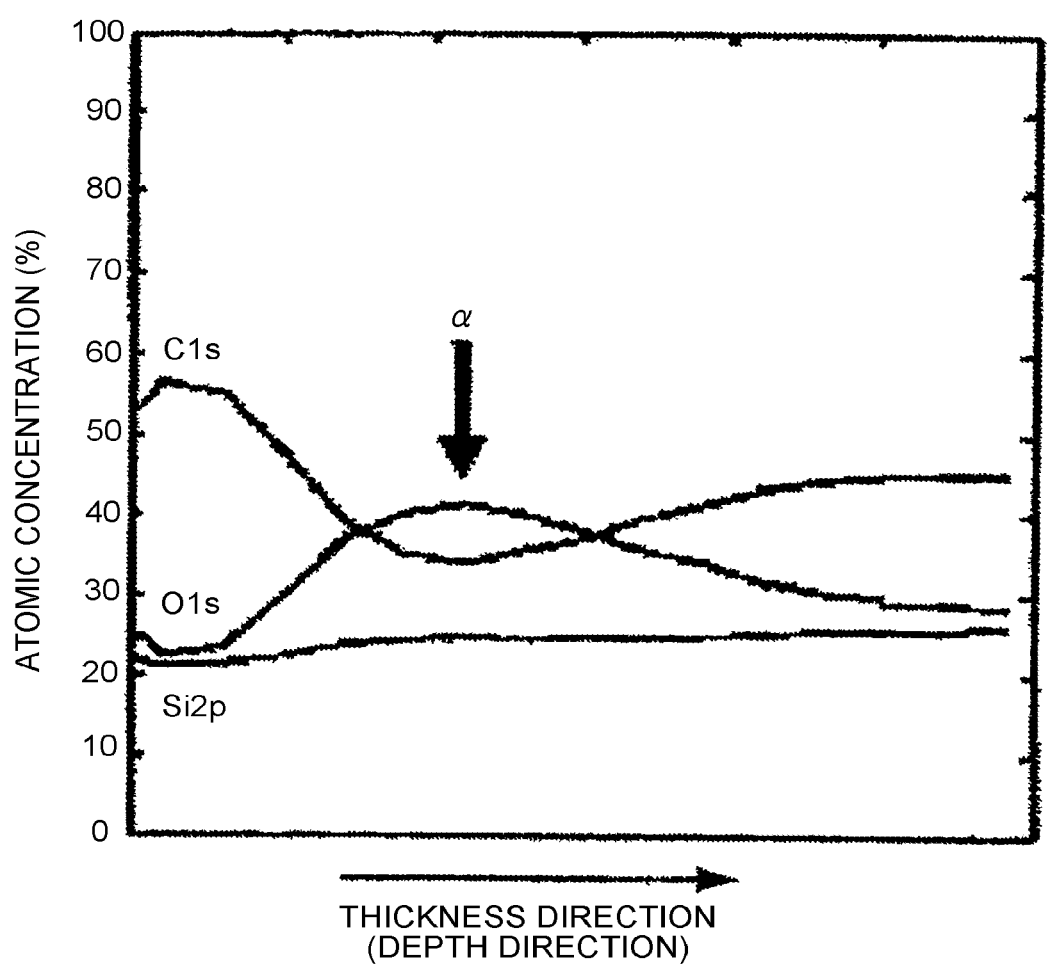
FIG. 2 is a characteristic diagram illustrating an XPS measurement result of an intermediate layer (silicone rubber) on which surface modification treatment and deactivation treatment are performed.

The silicone rubber has a siloxane bond, and includes principal components Si, O, and C. Thus, in a case of using the silicone rubber as the material of the intermediate layer 4, a wide scan spectrum of XPS is measured, and the atomic concentration in the depth direction of each atom present from a surface layer to the inside can be obtained based on a relative peak intensity ratio of each element. FIG. 2 illustrates one example thereof. Herein, atoms are Si, O, and C, and the atomic concentration is (atomic %).

FIG. 2 is a sample of the intermediate layer 4 obtained by using the silicone rubber and performing the surface modification treatment (plasma treatment) and the deactivation treatment. In FIG. 2, a horizontal axis indicates an analytical depth from the surface to an inside direction, and a vertical axis indicates the atomic concentration.

In a case of the silicone rubber, by measuring jumping-out energy of the electron in a 2p orbit of Si, an element bound to silicon and a binding state can be found. Thus, peak separation is performed from a narrow scan spectrum in the Si2p orbit indicating the binding state of Si, and a chemical bond state is obtained.

Figure 3:
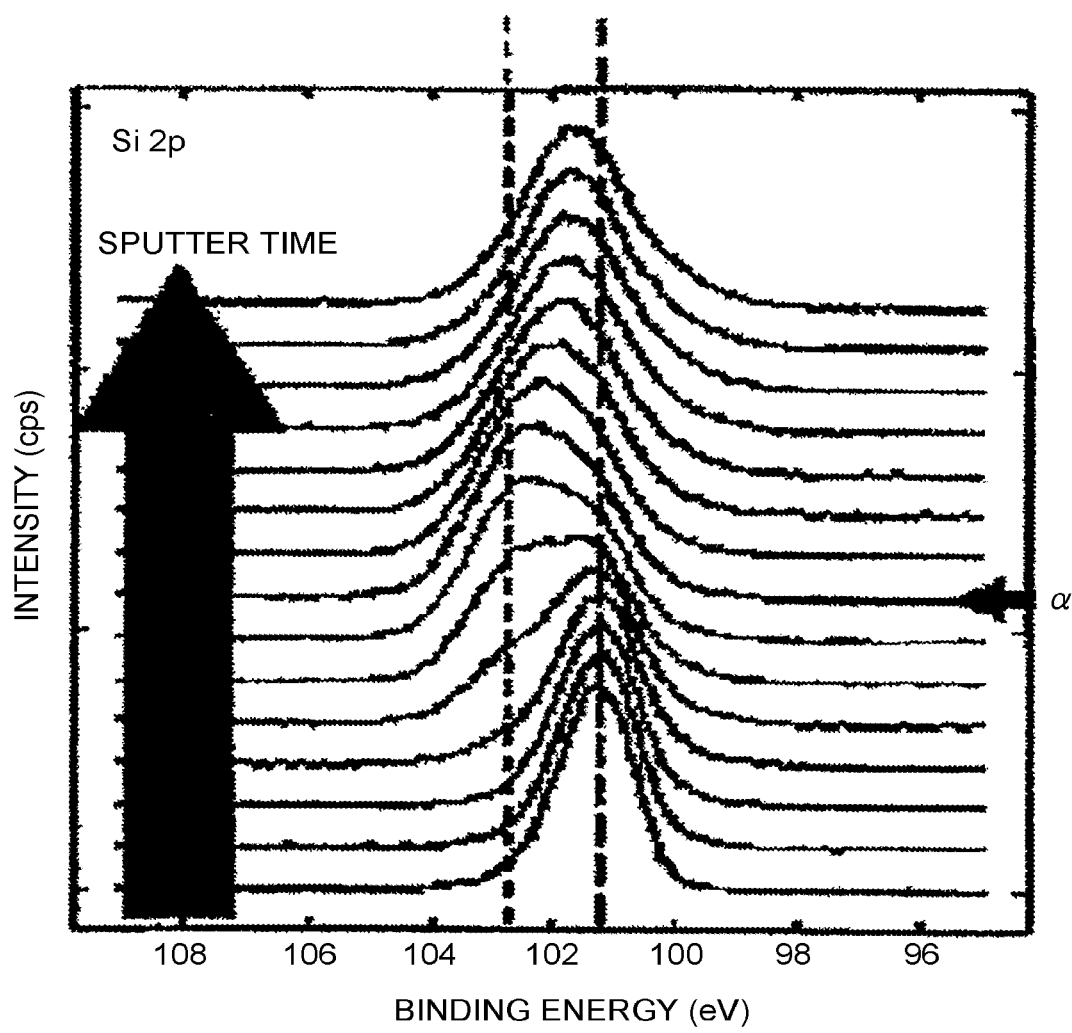
FIG. 3 is a graph representing variation in a thickness direction of an Si2p binding energy of the intermediate layer measured in FIG. 2.

FIG. 3 illustrates a result thereof. A measurement target of FIG. 3 is a sample used for measurement in FIG. 2. In FIG. 3, a horizontal axis indicates binding energy, and a vertical axis indicates an intensity ratio. A direction from the downside toward the upside indicates a measurement spectrum in the depth direction.

Typically, it is known that an amount of peak shift depends on the binding state, and in a case of the silicone rubber according to the embodiment, the peak shift toward a high energy side in the Si2p orbit indicates that the number of oxygen atoms bound to Si is increased.

Accordingly, when the surface modification treatment and the deactivation treatment are performed on the silicone rubber, the oxygen atoms are increased from the surface layer toward the inside to have a local maximum value, and carbon atoms are reduced to have a local minimum value. When analysis is further performed in the depth direction, the oxygen atoms are reduced and the carbon atoms are increased, so that atomic concentration that is substantially equivalent to that of untreated silicone rubber is obtained.

The local maximum value of the oxygen detected at a position of α in FIG. 2 matches Si2p binding energy shift toward a high energy side (position of α in FIG. 3), and it is indicated that increase in oxygen atoms results from the number of oxygen atoms bound to Si.

Figure 4:
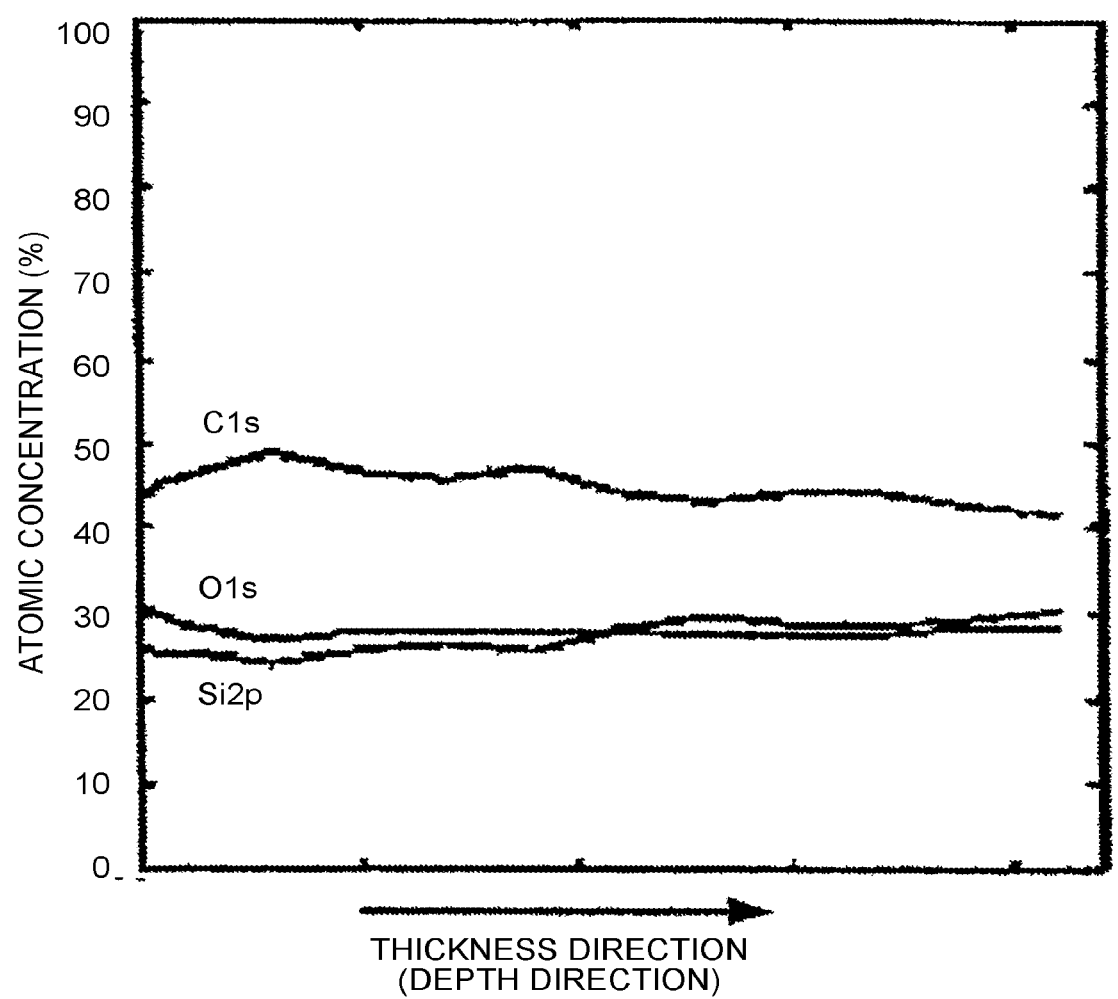
FIG. 4 is a characteristic diagram illustrating an XPS measurement result of an untreated intermediate layer (silicone rubber).
Figure 5:
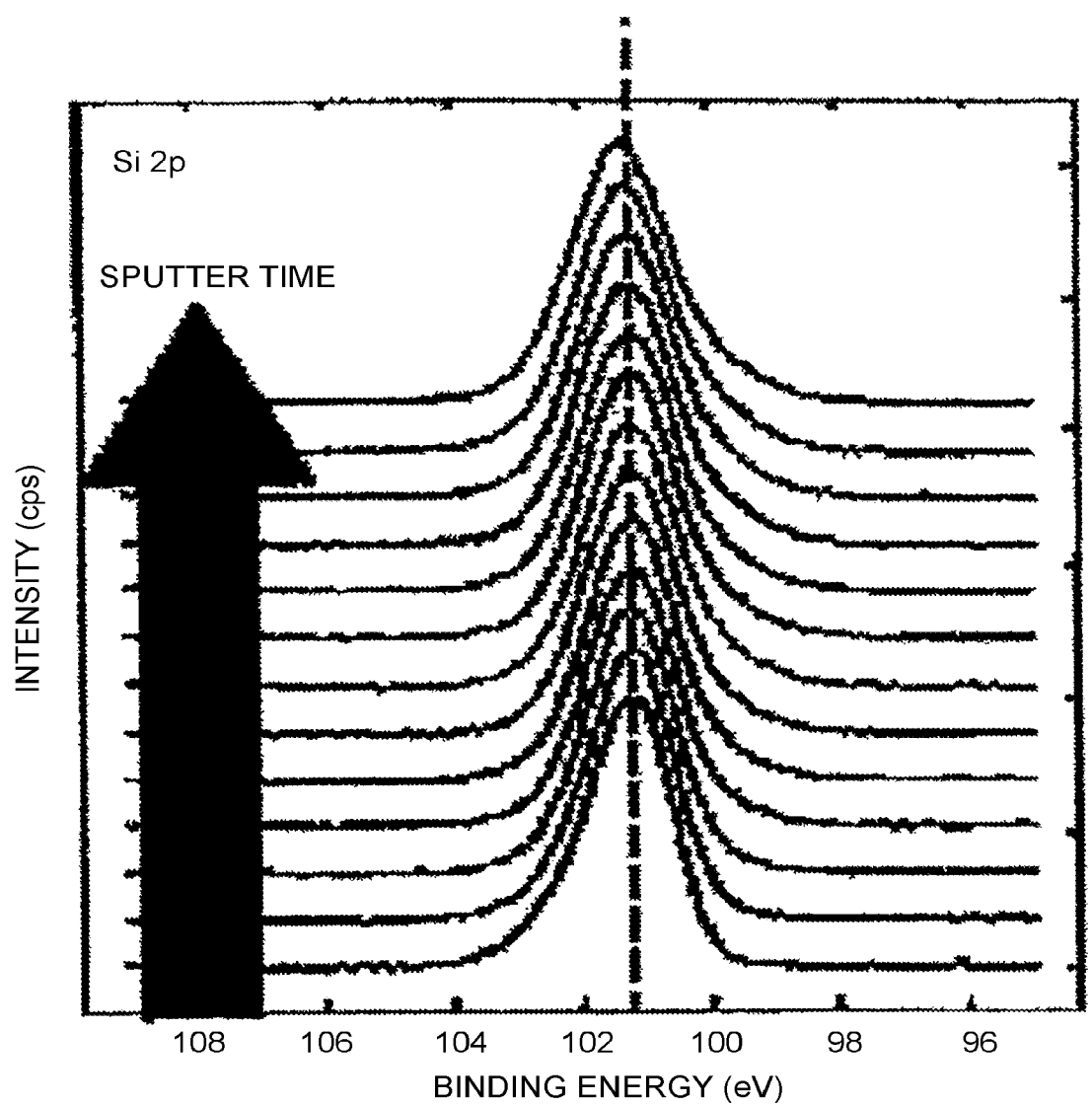
FIG. 5 is a graph representing variation in a thickness direction of an Si2p binding energy of the intermediate layer measured in FIG. 4.

FIG. 4 and FIG. 5 illustrate a result obtained by similarly analyzing untreated silicone rubber.

In FIG. 4, the local maximum value of oxygen concentration and the local minimum value of carbon concentration as illustrated in FIG. 2 are not found. With reference to FIG. 5, the Si2p binding energy shift is not found to be shift to the high energy side, so that it is confirmed that the number of oxygen atoms bound to Si is not changed.

As described above, by applying the deactivator such as a coupling agent to the surface of the intermediate layer 4 or causing the deactivator to permeate the surface thereof by dipping, the deactivator permeates the intermediate layer 4. In a case in which the coupling agent is a compound represented by the general expression (1) and the like, polyorganosiloxane is present in the intermediate layer 4 with concentration distribution, the distribution is such that oxygen atoms contained in the polyorganosiloxane have the local maximum value in the depth direction.

As a result, the intermediate layer 4 contains polyorganosiloxane having a silicon atom bound to three to four oxygen atoms.

A method of deactivation treatment is not limited to the dipping method. For example, it is sufficient to implement the distribution such that the oxygen atoms contained in the polyorganosiloxane have the local maximum value in the depth direction (thickness direction) of the intermediate layer 4, so that a method such as plasma CVD, PVD, sputtering, vacuum deposition, and combustion chemical vapor deposition may be used.

The intermediate layer 4 does not necessarily have an initial surface potential in a standing state. The initial surface potential in the standing state can be measured under the following measurement condition. Herein, "does not have an initial surface potential" means that the potential is equal to or smaller than ±10 V when measured under the following measurement condition.

Measurement Condition

Preprocessing: After standing for 24 h in an atmosphere having a temperature of 30° C. and relative humidity of 40%, removing static electricity for 60 sec (using SJ-F300 manufactured by Keyence)

Device: Treck Model344

Measurement probe: 6000B-7C

Measurement distance: 2 mm

Measurement spot diameter: Diameter 10 mm

In the element 1 according to the present embodiment, it is estimated that electric charges move to generate electricity when charging caused by a mechanism similar to frictional charging and generation of a surface potential difference caused by internal charge reservation generate imbalance in capacitance due to a difference of deformation amount based on a hardness difference between both surfaces of the intermediate layer 4.

The element 1 preferably has a space between the intermediate layer 4 and any one of the first electrode 2 and the second electrode 3. Accordingly, the power generation amount can be increased.

A method of providing the space is not limited, and can be appropriately selected in accordance with a purpose. For example, a spacer may be arranged between the intermediate layer 4 and at least one of the first electrode 2 and the second electrode 3.

A material, a form, a shape, a size, and the like of the spacer are not limited, and can be appropriately selected in accordance with a purpose. Examples of the material of the spacer include a polymeric material, rubber, metal, a conductive polymeric material, and a conductive rubber composition.

Examples of the polymeric material include polyethylene, polypropylene, polyethylene terephthalate, polyvinyl chloride, polyimide resin, fluororesin, and an acrylic resin. Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone.

Examples of the metal include gold, silver, copper, aluminum, stainless steel, tantalum, nickel, and phosphor bronze. Examples of the conductive polymeric material include polythiophene, polyacetylene, and polyaniline. Examples of the conductive rubber composition include a composition containing a conductive filler and rubber. Examples of the conductive filler include a carbon material (for example, Ketjen black, acetylene black, graphite, a carbon fiber, a carbon fiber, a carbon nanofiber, a carbon nanotube, and graphene), metal (for example, gold, silver, platinum, copper, iron, aluminum, and nickel), a conductive polymeric material (for example, a derivative of any of polythiophene, polyacetylene, polyaniline, polypyrrole, polyparaphenylene, and polyparaphenylene vinylene, or the derivative to which a dopant represented by an anion or a cation is added), and ion liquid.

Examples of the rubber include silicone rubber, modified silicone rubber, acrylic rubber, chloroprene rubber, polysulfide rubber, urethane rubber, butyl rubber, fluorosilicone rubber, natural rubber, ethylene-propylene rubber, nitrile rubber, fluororubber, isoprene rubber, butadiene rubber, styrene-butadiene rubber, acrylonitrile-butadiene rubber, ethylene-propylene-diene rubber, chlorosulfonated polyethylene rubber, polyisobutylene, and modified silicone.

Examples of the form of the spacer include a sheet, a film, woven fabric, nonwoven fabric, a mesh, and a sponge.

A shape, a size, a thickness, and an installation place of the spacer can be appropriately selected in accordance with the structure of the element.

Figure 6:
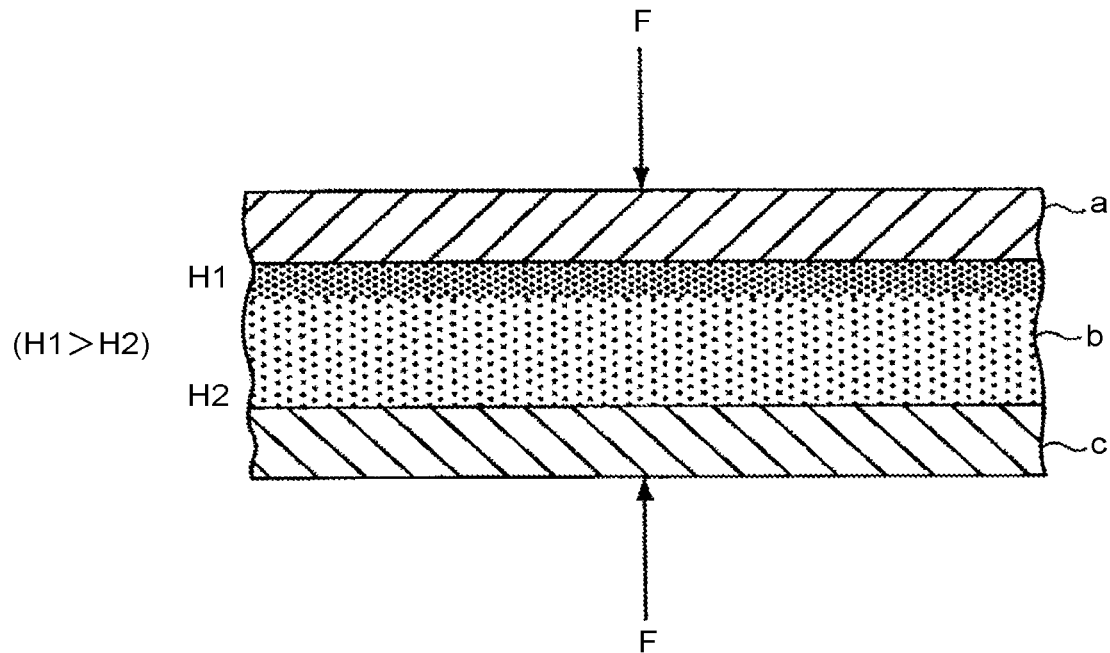
FIG. 6 is a schematic cross-sectional view for explaining a characteristic of an element including the intermediate layer on which surface modification treatment and deactivation treatment are performed.

As illustrated in FIG. 6, when the first electrode is denoted by a, the intermediate layer is denoted by b, and the second electrode is denoted by c, in a case of performing the surface modification treatment or the deactivation treatment described above on the first electrode a side of the intermediate layer b, the first electrode a side of the intermediate layer b becomes harder than the second electrode c side thereof. Thus, the universal hardness is represented as H1>H2.

Accordingly, when pressurizing forces F as the same deformation applying force affect the first electrode a side and the second electrode c side, a deformation degree on the first electrode a side of the intermediate layer b becomes smaller than that on the second electrode c side thereof.

The following describes a detailed configuration of the intermediate layer 4 according to the first example of the present invention.

Figure 7:
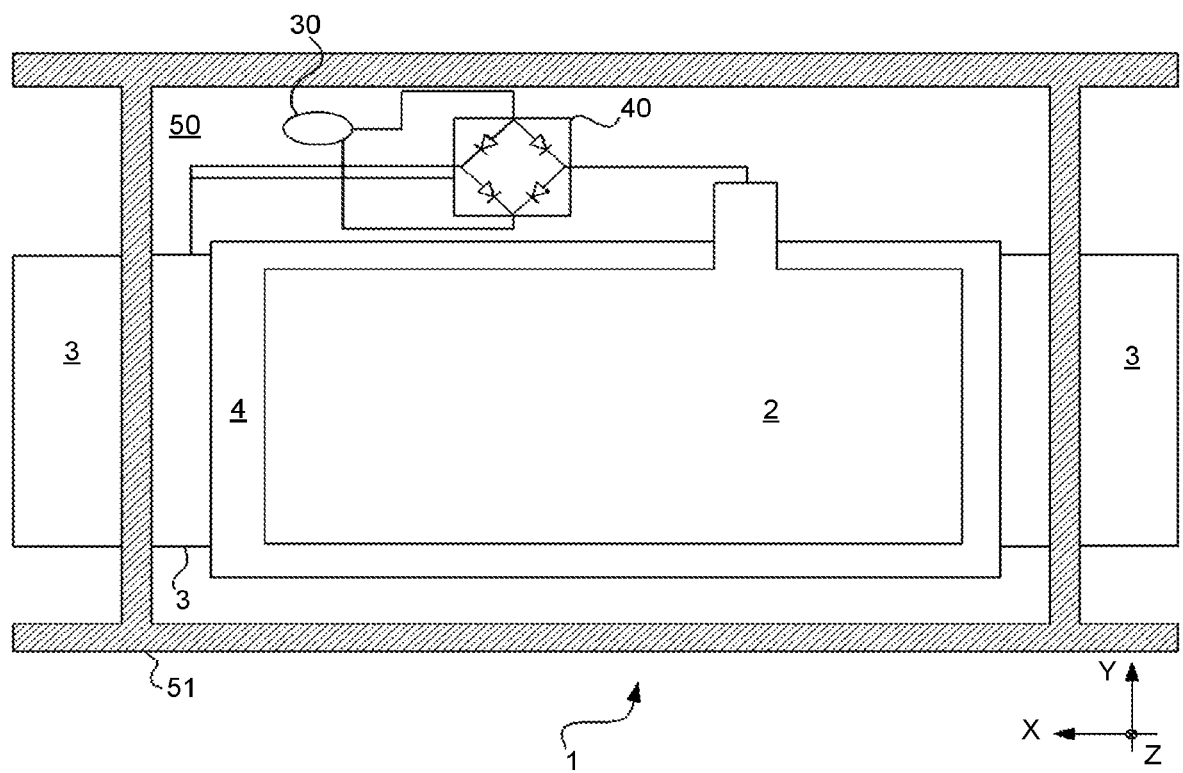
FIG. 7 is a view illustrating an example of the entire configuration of the element according to the first example of the present invention.

As illustrated in FIG. 7, the element 1 includes the first and the second electrodes 2 and 3 as a pair of electrodes, the intermediate layer 4 having deformability arranged between the first electrode 2 and the second electrode 3, an LED 30 serving as a detection unit for checking operation, and a rectifier circuit 40.

The element 1 also includes a PET film 50 serving as an exterior member formed to cover the first electrode 2, the second electrode 3, and the intermediate layer 4.

The intermediate layer 4 is rubber or a rubber composition formed by performing surface modification treatment on a silicone rubber member by corona discharge.

As the silicone rubber member used for the intermediate layer 4, silicone rubber (KE-1603 manufactured by Shin-Etsu Chemical Co., Ltd.) is used, and a film thickness thereof is about 100±10 μm. That is, the intermediate layer 4 contains a silicon compound as a material.

The silicone rubber member is obtained by performing blade coating on silicone rubber as a material to be calcined at a high temperature of 120° C. for 30 minutes, performing corona discharge treatment thereon with an applied voltage of 100 V and integrated energy of 500 J/cm$^2$, and processing the silicone rubber to be a rectangular shape being 20 mm long by 50 mm wide.

Herein, the intermediate layer 4 is assumed to be rubber or a rubber composition containing a silicon compound as a material, but is not limited thereto. The intermediate layer 4 may be any substance containing a silicon compound as a material and having deformability. The deformability includes flexibility and rubber elasticity. More specifically, the deformability indicates deformability in a degree of being deformed by external force applied by the user.

The first electrode 2 is patterned to be placed on the silicone rubber member.

As illustrated in FIG. 7, the LED 30 is connected to the rectifier circuit 40, and is lit by detecting energization of the rectifier circuit 40. In the following description, when a voltage generated between electrodes of the element 1 or a voltage between upper and lower surfaces of the intermediate layer 4 needs to be measured, a voltmeter such as an oscilloscope may be arranged at the position to which the LED 30 is connected.

Figure 8A:
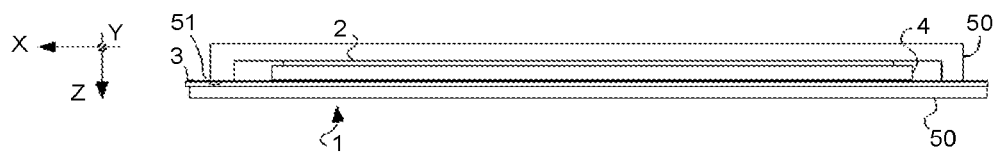
FIG. 8A is a cross-sectional view illustrating an example of a configuration in which the element illustrated in FIG. 7 is caused to have a cell shape.
Figure 8B:
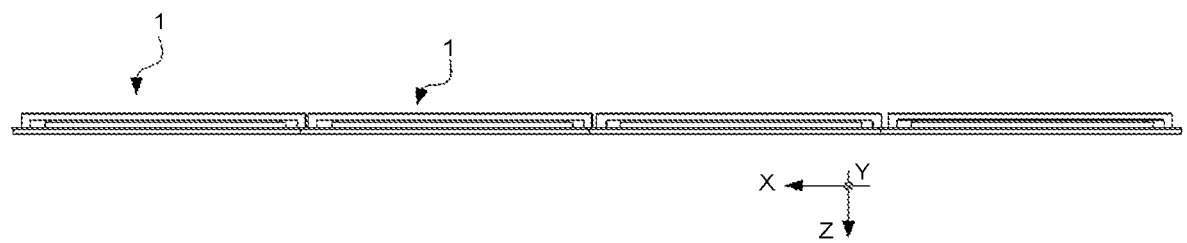
FIG. 8B is a view illustrating an example of a state in which elements 1 illustrated in FIG. 7 are coupled to each other and arranged side by side to be one power generation element.

The first electrode 2, the second electrode 3, and the intermediate layer 4 are covered with the PET film 50 as an exterior member, as illustrated in FIG. 8A, and are sealed by a sealing unit 51. Such a packaged state in which the pair of electrodes 2 and 3 and the intermediate layer 4 are covered with the exterior member is specifically represented by wording "cell shape". That is, when being held in a mode illustrated in FIG. 7, the element 1 has a function as a cell in which the element 1 and the rectifier circuit 40 are integrally formed. Elements 1 may be coupled to be arranged side by side as illustrated in FIG. 8B, and may be caused to be one power generation element.

In the present example, as the second electrode 3, AL-PET 9-100 (manufactured by PANAC Corporation, the thickness of aluminum foil is 9 μm, the thickness of PET film is 100 μm) is used.

The second electrode 3 is a continuous belt-shaped electrode, and arranged being in contact with the intermediate layer 4.

A spacer and the like may be arranged between the first electrode 2 or the second electrode 3 and the intermediate layer 4. With such a configuration, peeling charging is easily caused in the intermediate layer 4 as described later, so that a piezoelectric effect of the element 1 is improved.

The following describes processing methods of second to fifth examples as other examples of the element 1, and first to third comparative examples that should be compared with the element 1. Description overlapping with that of the first example will be appropriately omitted.

Second Example

Instead of the plasma treatment in the first example, irradiation treatment was performed by using a UV irradiation lamp (VL-215.C manufactured by Vilber Lourmat) under a condition in a nitrogen atmosphere having a wavelength of 254 nm, an integrated amount of light of 300 J/cm$^2$, and an oxygen partial pressure equal to or smaller than 5000 ppm, and the element was formed similarly to the first example.

Third Example

Instead of the plasma treatment in the first example, irradiation treatment was performed by using electron beam irradiation (a line irradiation type low-energy electron beam irradiation source manufactured by Hamamatsu Photonics K. K.) under a condition in a nitrogen atmosphere having an irradiation amount of 1 MGy and an oxygen partial pressure equal to or smaller than 5000 ppm, and the element was formed similarly to the first example.

Fourth Example

Figure 9A:
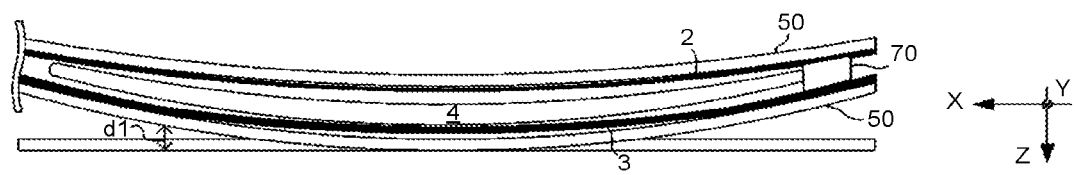
FIG. 9A is a partially enlarged side view illustrating an example of a configuration of a fixing method according to a fourth example of the present invention.
Figure 9B:
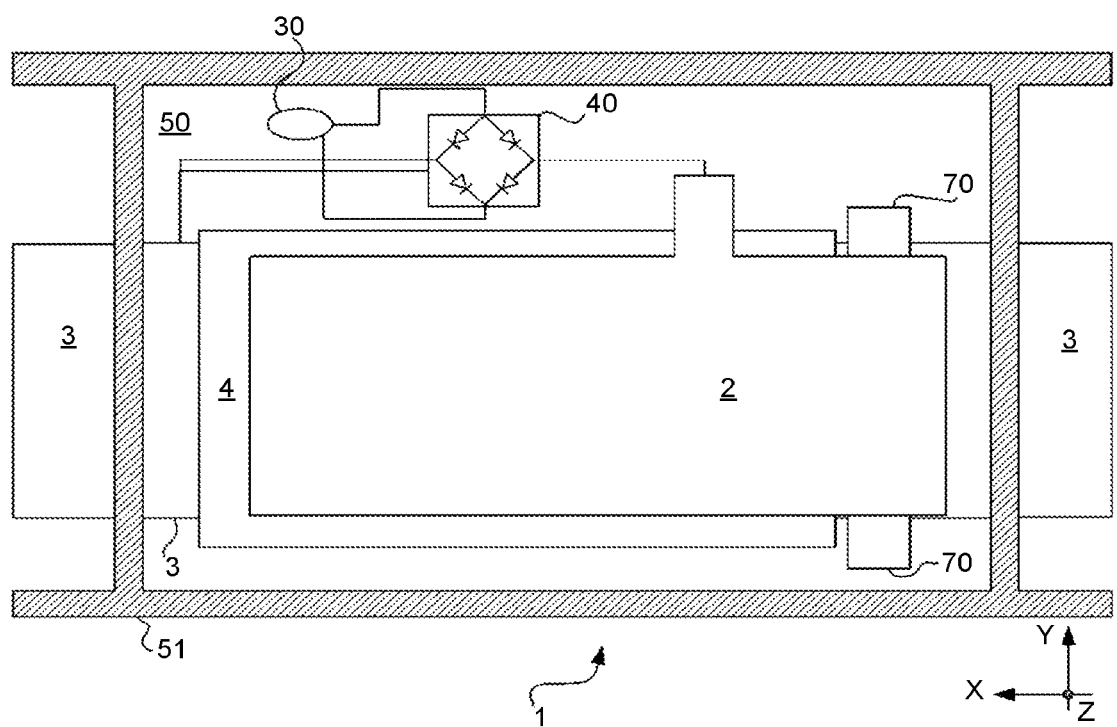
FIG. 9B is a top view illustrating an example of a configuration of the fixing method according to the fourth example of the present invention.

Regarding a fixing structure of the first electrode 2 and the second electrode 3, as illustrated in FIG. 9A and FIG. 9B, a fixing layer 70 is positioned between the first electrode 2 and the second electrode 3 to bond the first electrode 2 to the second electrode 3.

Figure 10A:
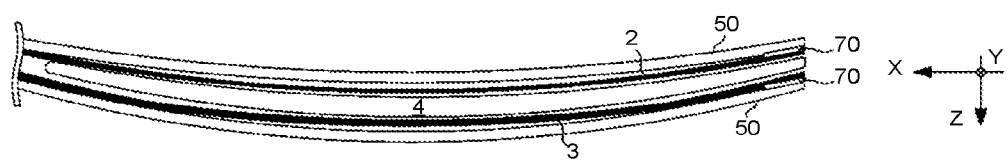
FIG. 10A is a partially enlarged side view illustrating another example of the configuration of the fixing method according to the fourth example of the present invention.
Figure 10B:
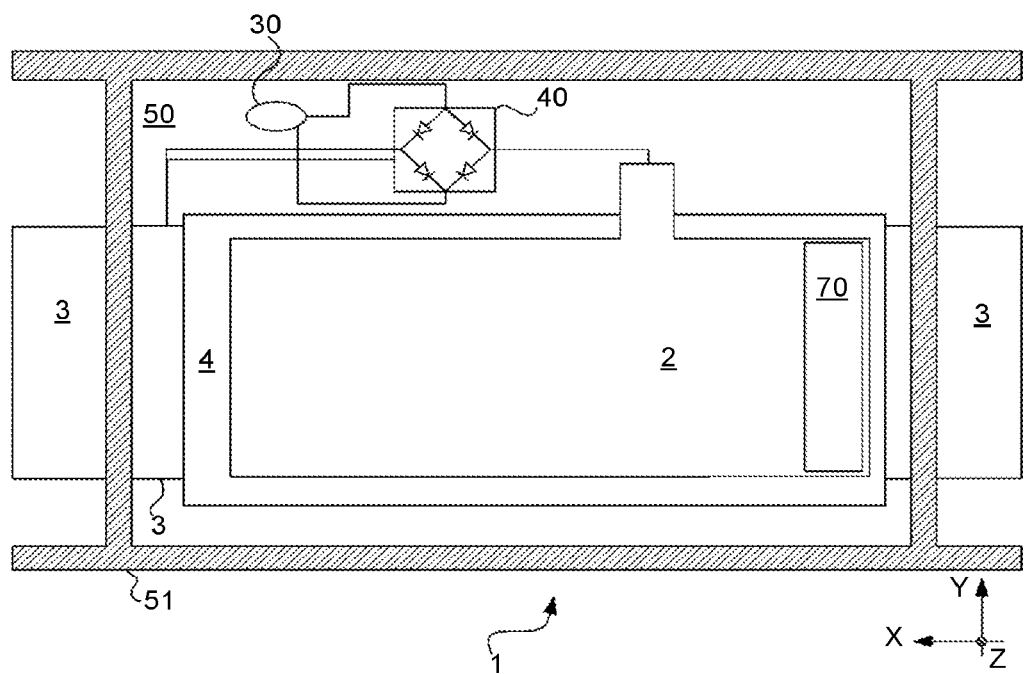
FIG. 10B is a top view illustrating another example of the configuration of the fixing method according to the fourth example of the present invention.

With such a configuration, when the element 1 is bent, the first electrode 2 or the second electrode 3 and the intermediate layer 4 slidingly move, in other words, slide with respect to each other. Alternatively, this configuration example may be a configuration as illustrated in FIG. 10A and FIG. 10B in which the first electrode 2 and the PET film 50 are bonded to each other, and similarly the second electrode 3 and the PET film 50 are bonded to each other to be slidingly moved based on a difference in moving distance $d_1$ due to a curvature at the time of bending.

Fifth Example

As the silicone rubber member of the intermediate layer 4, rubber (Dow Corning DY35-2147 manufactured by Toray Industries, Inc.) is used. The rubber contains an iron oxide as a material. Thus, the rubber includes an unpaired electron derived from the iron oxide in addition to an unpaired electron derived from a silicon compound generated by surface treatment.

First Comparative Example

Metal coated piezo film sheet (200×280×110 CuNi manufactured by Tokyo Sensor Co., Ltd.) was cut out to be 20 mm long by 50 mm wide, all metal portions of the first electrode 2 and the second electrode 3 in the first example were removed by etching, and upper and lower electrodes were connected to each other as illustrated in FIG. 8A and FIG. 8B to form the element.

That is, in the present embodiment, a CuNi film coated on the piezo film sheet is used as an electrode.

Second Comparative Example

Upper and lower surfaces of a metal coated piezo film sheet similar to that in the first comparative example were entirely etched with an aqueous solution of ferric chloride (H-200A manufactured by Sunhayato Corp.). This sheet was put in in place of the silicone rubber member in the first example to form the element.

Third Comparative Example

The element was formed by using the silicone rubber in the first example on which surface treatment was not performed.

Fourth Comparative Example

With a configuration similar to that in the first example, a member obtained by substantially uniformly performing charging treatment on the entire polypropylene (PP) film by corona discharge was cut in a size of 20 mm long by 50 mm wide to be used as the intermediate layer 4. In a corona charger, a corona needle and an electrode are arranged to be opposed to each other, an electric discharge can be performed by DC high-voltage power supply device (HAR-20R5 manufactured by Matsusada Precision Inc.), and a grid is arranged between the corona needle and the electrode. A voltage can be applied to the grid from a power supply for a grid different from the DC high-voltage power supply device. A thin film that is charged (formed to be an electret) under a discharging condition described below was used as the intermediate layer 4 to form the element.

Charging Condition

Corona needle voltage: −10 kV

Grid voltage: −1 kV

A potential difference between both surfaces of the intermediate layer 4 made of polypropylene was about 200 V.

Fifth Comparative Example

Used was a polypropylene (PP) film having a thickness of 100 μm on which charging treatment was substantially uniformly and entirely performed by corona discharge similarly to the fourth comparative example. The potential difference between both surfaces of the intermediate layer 4 was about 200 V similarly to the fourth comparative example.

The film was caused to be 20 mm long by 50 mm wide similarly to the fourth comparative example and put in in place of the silicone rubber member in the first example, and an adhesive agent was arranged and applied in a dot shape having a diameter of about 1 mm and a thickness of 100 μm at regular intervals of about 10 mm using a mask pattern on a surface to be in contact with the first electrode 2 to partially point-bond the first electrode 2 to the intermediate layer 4.

Each of the elements formed as described above was evaluated as follows, and the result illustrated in Table 1 was obtained. Refer to the result illustrated in Table 1, by comparing the first, the second, the third, the fourth, and the fifth examples with the second comparative example, it can be found that the element using the material and the configuration according to the present invention has high power generation performance, and breakdown is prevented from being caused by generation of discharge.

In view of durability performance, when the first, the second, the third, the fourth, and the fifth examples are compared with the fifth comparative example, the element having a point-bonded structure has low breakdown durability.

By comparing the third example with the third comparative example, it can be found that any one of the same pieces of silicone rubber having no unpaired electron has poor power generation performance. That is, by performing surface treatment on the silicone rubber member, the unpaired electron is stably maintained as described later, which contributes to improvement in power generation performance.

TABLE 1

| | Configuration | | | | | |
|---|---|---|---|---|---|---|
| | Intermediate layer | Film thickness (μm) | Surface modification | Configuration of power generation element | Upper and lower electrodes | ESR |
| First example | KE-1603 A/B | 100 | Corona treatment | Upper electrode slip | AL-PET9-100 | ○ |
| Second example | KE-1603 A/B | 100 | UV irradiation | Upper electrode slip | AL-PET9-100 | ⊙ |
| Third example | KE-1603 A/B | 100 | Electron beam irradiation | Upper electrode slip | AL-PET9-100 | ⊙ |
| Fourth example | KE-1603 A/B | 100 | Electron beam irradiation | Upper electrode slip | AL-PET9-100 | ⊙ |
| Fifth example | DY35-2147 A/B | 100 | Electron beam irradiation | Upper electrode slip | AL-PET9-100 | ○ |
| First comparative example | PVDF with CuNi electrode | 110 | None | Upper and lower electrodes adhere closely to each other | CuNi sputtering film | X |
| Second comparative example | PVDF without CuNi electrode | 110 | None | Upper electrode slip | AL-PET9-100 | X |
| Third comparative example | KE-1603 A/B | 100 | None | Upper electrode slip | AL-PET9-100 | X |
| Fourth comparative example | Polypropylene | 100 | Corona treatment | Upper electrode slip | AL-PET9-100 | X |
| Fifth comparative example | Polypropylene | 100 | Corona treatment | Upper electrode point-bonded | AL-PET9-100 | X |

| | Power generation performance | | | Durability performance | | |
|---|---|---|---|---|---|---|
| | Magnification | Number of times (initial value: attenuation 10%) | Determination | Number of times (initial value: attenuation 10%) | Determination | Synthetic Determination |
| First example | 7 | 10000 or more | ○ | 1000 or more | ○ | ○ |
| Second example | 8 | 10000 or more | ○ | 1000 or more | ○ | ○ |
| Third example | 11 | 10000 or more | ○ | 1000 or more | ○ | ○ |
| Fourth example | 11 | 10000 or more | ○ | 1000 or more | ○ | ○ |
| Fifth example | 10 | 10000 or more | ○ | 1000 or more | ○ | ○ |
| First comparative example | 1 | 10000 or more | X | 1000 or more | ○ | X |

TABLE 1-continued

| | | | | | | |
|---|---|---|---|---|---|---|
| Second comparative example | 2 | 1500 (with discharge) | X | 232 (with discharge) | X | X |
| Third comparative example | 3 | 10000 or more | X | 1000 or more | ○ | X |
| Fourth comparative example | 1 | 1700 (with discharge) | X | 255 (with discharge) | X | X |
| Fifth comparative example | 3 | 10000 or more | X | 121 (bonded part breakdown) | X | X |

Evaluation 1: Power Generation Performance

Figure 11:
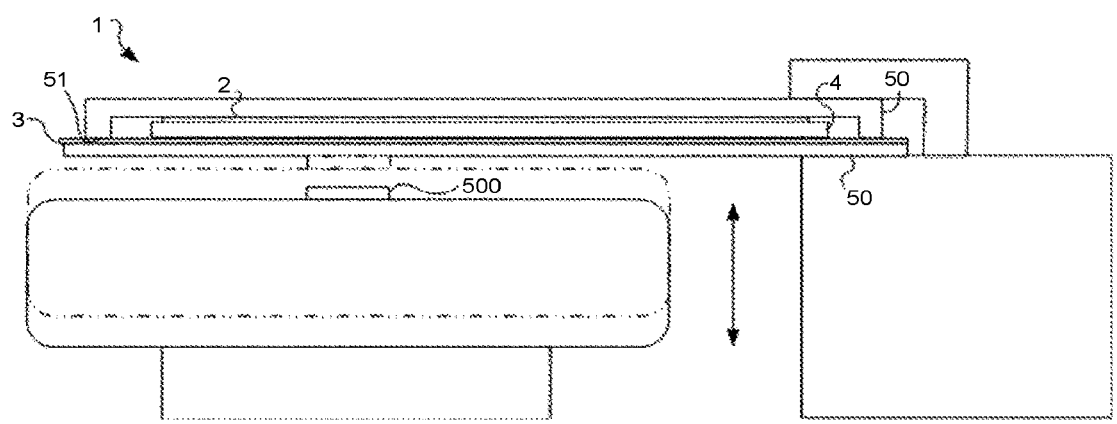
FIG. 11 is a view illustrating an example of a configuration of a vibration evaluation device used for vibration evaluation.

The power generation performance of the element 1 is measured by using a vibration evaluation device illustrated in FIG. 11.

The vibration evaluation device is configured by combining a function generator SG-4105 (manufactured by IWATSU ELECTRIC CO., LTD.) and a vibration testing machine MES151 (manufactured by Mitutoyo Corporation), and performs evaluation based on voltage waveforms of both surfaces of the element 1 at the time when a vibrating head part 500 vertically moves.

The power generation element 1 formed in a cell shape was horizontally fixed to the vibrating head part 500, and is vibrated with a vibration width of 5 mm and a vibration frequency of 10 Hz.

The voltage waveform measured when the power generation element 1 is vibrated as described above is a voltage between the first electrode 2 and the second electrode 3. Table 1 illustrates a p-p value of a maximum value and a minimum value of such a voltage.

As a basis for evaluation, the p-p value of the voltage in the first comparative example that was similarly measured is assumed to be 1 as a standard, magnification equal to or larger than 5 is determined to be a favorable record, and represented by o in a determination column.

Regarding the above measurement, an average value of five samples is taken, and a durability test is performed in a reciprocative manner 10000 times. For the second comparative example the reduction rate of which is large, the number of times when the initial value is reduced by 10% is represented as "number of times".

Evaluation 2: Bending Durability Performance

Figure 12A:
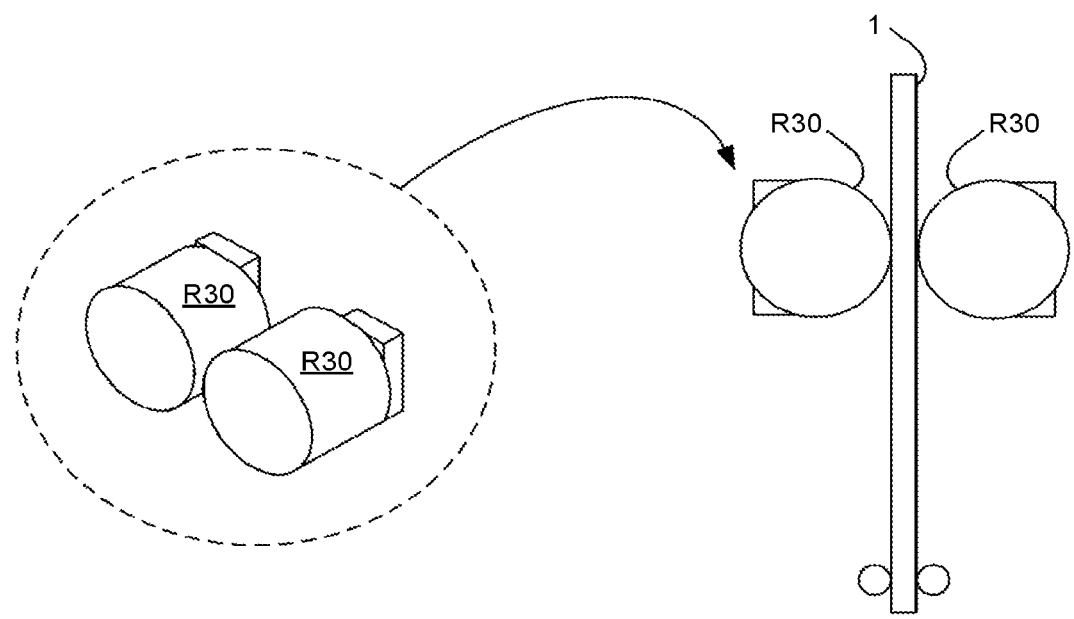
FIG. 12A is a view illustrating an example of a state before bending of an operation of a bending test device used for durability evaluation.
Figure 12B:
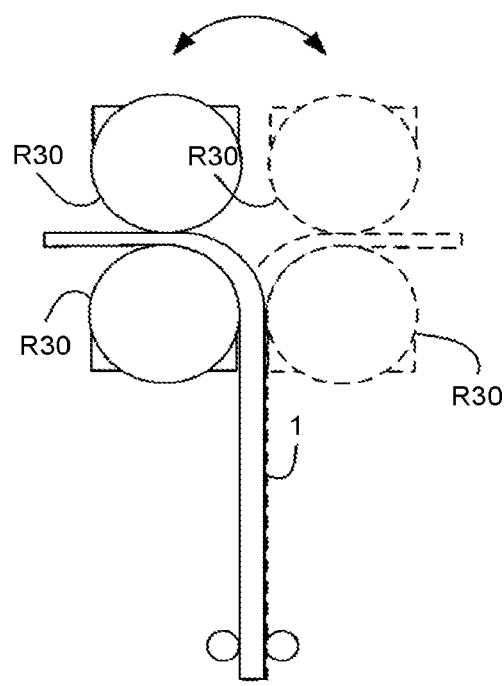
FIG. 12B is a view illustrating an example of a state after bending of an operation of the bending test device used for durability evaluation.

To measure bending durability performance of the element 1 formed in a cell shape, a bending test of 90° was performed as illustrated in FIG. 12A and FIG. 12B using a desktop durability test machine TCDM111LH (manufactured by YUASA SYSTEM Co., Ltd.).

A sample was arranged in the middle of jigs of R30 to be subjected to the durability test reciprocating 10 times per minute and performed 1000 times, and the p-p value of the voltage was measured.

Similarly to Evaluation 1, the number of times when the initial value is reduced by 10% is described in the column of "number of times".

Evaluation 3: Electron Spin Resonance (ESR) Measurement

Figure 13A:
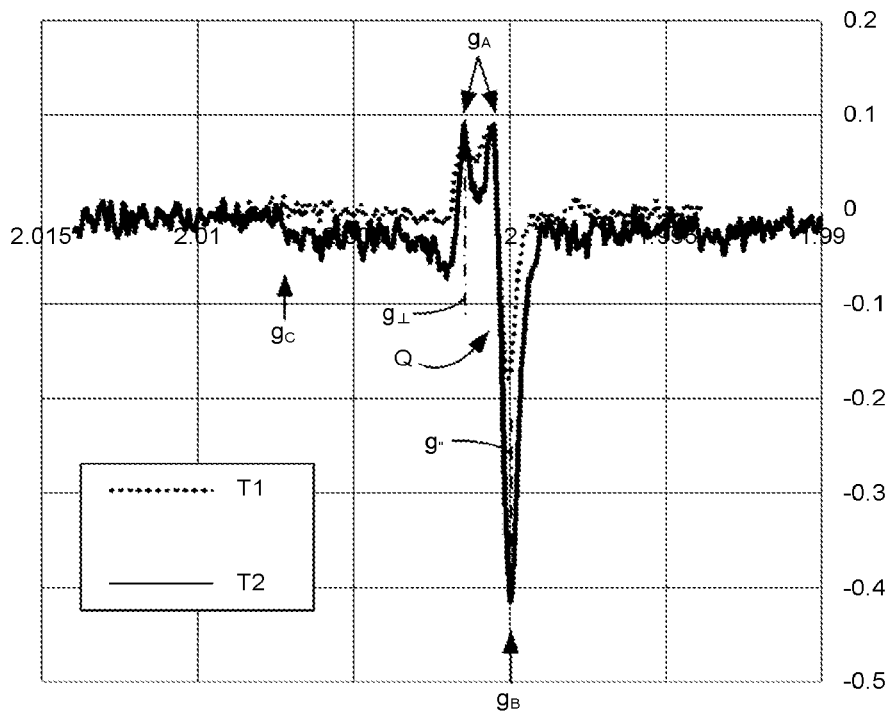
FIG. 13A is a diagram illustrating an example of an ESR measurement result of the intermediate layer.

As a material evaluation test for the intermediate layer 4, measurement is performed by using an X-band ESR measuring device EMX-nano (manufactured by Bruker Corporation). Regarding such measurement results, FIG. 13A illustrates a measurement result T1 in a case in which an environment temperature is a room temperature by a dashed line, and a measurement result T2 in a case in which the environment temperature is −150° C. by a solid line. Similarly, FIG. 13B illustrates a result of ESR measurement using the intermediate layer 4 in the third comparative example.

Typically, in electron spin resonance, a g value as a function of magnetic field strength is represented as a horizontal axis, and a first differential waveform of an absorption spectrum is represented as a vertical axis. Herein, g value is a value specific to each ESR signal that is determined based on the number of vibrations (v) of a microwave applied to the sample and strength (H) of a resonance magnetic field. The ESR signal and a lattice defect are identified with the g value.

With the ESR signal, a resonance phenomenon is observed, the resonance phenomenon being caused by absorption of a microwave (an electromagnetic wave having a frequency of 9.4 GHz and a wavelength of about 3 cm: X-band) following transition of spin of the unpaired electron, so that detection of the ESR signal means that the unpaired electron is present in the sample. In other words, detection of a peak of a measurement waveform when the horizontal axis indicates the g value is equivalent to detection of the unpaired electron.

Figure 13B:
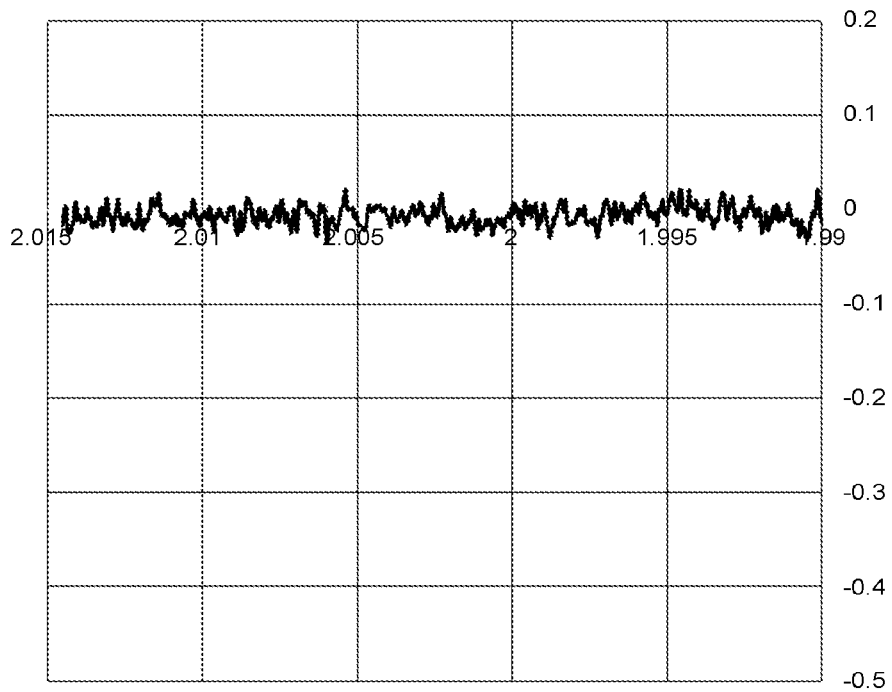
FIG. 13B is a diagram illustrating another example of the ESR measurement result of the intermediate layer.

FIG. 13A illustrates an ESR signal of the intermediate layer 4 explained in the third example, and FIG. 13B illustrates an ESR signal of the intermediate layer 4 in the third comparative example. By comparing FIG. 13A with FIG. 13B, it is obvious that the intermediate layer 4 according to the present embodiment includes the unpaired electron.

The following describes a way of understanding of FIG. 13A in more detail. In an isotropic material, it is known that ESR signal strength is substantially symmetrical to a reverse position thereof. On the other hand, waveforms T1 and T2 illustrated in FIG. 13A are both asymmetrical to a reverse position Q, so that it can be found that the intermediate layer 4 has anisotropy in the structure.

Peak values $g_A$ and $g_B$ of the ESR signal represented in the measurement results T1 and T2 both favorably match E' center g⊥ (=2.0014) and E' center g// (=2.0004) measured with a defect in quartz glass.

It can be considered that the fact described above indicates that a defect of oxygen O is generated in silicone rubber by surface treatment, and the unpaired electron is formed at the defect position.

When E' center g// is detected at two peaks in the structure of typical quartz glass, the structure has anisotropy in a depth direction of the sample, that is, in a thickness direction of the intermediate layer 4.

Thus, when the intermediate layer 4 according to the present embodiment has two peaks at g values between 2.004 and 1.998 in the measurement result T1, the structure is considered to have anisotropy in the thickness direction of the intermediate layer 4.

In the measurement result T2, a peak value $g_c$ of the ESR signal is detected at a g value between 2.070 and 2.001.

Typically, in low-temperature measurement at −150° C., influence of thermal motion and relaxation time of an electron is reduced, so that sensitivity of the ESR signal is improved, and the ESR signal that is hardly viewed in a room temperature environment is measured.

In the measurement result T2, the peak value $g_c$ that is not detected in the measurement result T1 is considered to indicate a peroxide radical.

That is, the intermediate layer 4 according to the present embodiment "has at least one peak at a g value between 2.004 and 1.998 when being measured by using an electron spin resonance device".

As is clear from the measurement result T2, the intermediate layer 4 according to the present embodiment "has at least one peak at a g value between 2.070 and 2.001 when being measured at −150° C. by using an electron spin resonance device".

Based on the measurement results described above, using a peak in a negative direction of the spectrum represented in the measurement result T2 in the third example as a standard, Table 1 indicates 80% or more as ⊚, about 30% as o, and no peak as ×.

The same measurement was performed on the sample in the third example at least six months after the surface modification treatment, and it was confirmed that the same spectrum was observed. That is, according to the present invention, the structure of the unpaired electron is stably maintained in the intermediate layer 4.

The following describes an effect of having the unpaired electron in the intermediate layer 4.

FIG. 10A is a schematic diagram illustrating an operation in a case in which the element 1 illustrated in FIG. 1 is bent by external force.

When the first electrode 2 or the second electrode 3 is brought into contact with the surface of the intermediate layer 4, and is separated therefrom or slides thereon due to deformation of the element 1, the electron moves due to a surface work function difference between metal of an electrode portion and the intermediate layer 4.

Typically, such electrostatic movement of the electron cannot be large electric energy, what is called power generation, because the electron flows out with time. However, when the unpaired electron is present in the intermediate layer 4, the unpaired electron traps the electron, so that electric charges Q are accumulated.

Specifically, in a case in which the intermediate layer 4 has rubber elasticity, contact and separation tend to be repeatedly caused due to the deformation, and a large charging amount can be obtained.

Due to such charging, the intermediate layer 4 serves as a capacitor and the like, and electromotive force represented as $V=Q/C=(Q \times \Delta d)/(\varepsilon \times A)$ is generated. Herein, V indicates electromotive force generated between the first electrode 2 and the second electrode 3, $\varepsilon$ indicates a dielectric constant, A indicates an area of the element 1, and $\Delta d$ indicates a displacement amount.

With such a configuration, the element 1 functions as a power generation element that converts deformation caused by external force into electric energy.

In such deformation, a clearance part separated from one of the first electrode 2 and the second electrode 3 may be arranged on a surface of the intermediate layer 4 containing a silicon compound including the unpaired electron as a material. With such a configuration, deformation is easily generated such that one of the first electrode 2 and the second electrode 3 is brought into contact with and separated from the intermediate layer 4, and power generation efficiency of the element 1 is improved.

The deformation is not limited to displacement in the thickness direction of the element 1, but may be deformation such that one of the first electrode 2 and the second electrode 3 and the intermediate layer 4 slide on each other. That is, the deformation may be such that, when the element 1 is bent by external force, at least one of the pair of electrodes and the intermediate layer 4 slide on each other due to a difference in a moving distance $d_1$ caused by a curvature.

In the present embodiment, the fixing layer 70 is fixed while having an insulation property between the first electrode 2 and the second electrode 3, and is fixed such that, when the element 1 is bent by external force, at least one of the pair of electrodes and the intermediate layer 4 slide on each other due to a difference in the moving distance $d_1$ caused by the curvature.

With such a configuration, even when the element 1 is bent by external force, the element 1 functions as a power generation element that converts deformation caused by the external force into electric energy.

In the fourth example, the PET film 50 and at least part of the first electrode 2 or the second electrode 3 are fixed, and at least one of the first electrode 2 and the second electrode 3 and the intermediate layer 4 slide on each other due to a difference in the moving distance $d_1$ caused by the curvature when the element 1 is bent by external force.

With such a configuration, even when the element 1 is bent by external force, the element 1 functions as a power generation element that converts deformation caused by the external force into electric energy.

A power generation device including the element 1 described in the first to the fifth examples and the rectifier circuit 40 and having resilience with respect to external force may be used.

With such a configuration, even when the element 1 is bent by external force, the element 1 repeatedly converts deformation caused by the external force into electric energy, so that the element 1 has a function as a power generation device that can continuously generate power.

The preferred embodiments of the present invention have been described above, but the present invention is not limited to the specific embodiments. The present invention can be variously modified or changed without departing from the gist of the invention described in CLAIMS unless otherwise specifically noted.

For example, the element described in the above example may be used as not only the power generation element but also a sensor serving as a detection element that detects contact as an electric signal. The element may be any element that converts external force into electric energy to be utilized.

The effect described in the embodiments of the present invention merely exemplifies the most preferred effect caused by the present invention, and the effect of the present invention is not limited to the effect described in the embodiments of the present invention.

REFERENCE SIGNS LIST

1 Element (power generation element) (cell) (power generation device)
2 Pair of electrodes (first electrode)

3 Pair of electrodes (second electrode)
4 Intermediate layer
40 Rectifier circuit
50 Exterior member (PET film)
51 Sealing unit
70 Fixing structure (fixing layer)

CITATION LIST

Patent Literature

Patent Literature 1: Japanese Patent Application Laid-open No. 2015-198154
Patent Literature 2: WO 2013/157643
Patent Literature 3: Japanese Patent No. 5699641
Patent Literature 4: Japanese Patent No. 3694740

The invention claimed is:

1. An element, comprising:
a pair of electrodes; and
an intermediate layer having deformability, arranged between and in direct contact with the pair of electrodes, and containing, as a material, a silicon compound having undergone surface treatment to produce unpaired electrons in the silicon compound,
the element converting deformation of the intermediate layer into electric energy by generating a voltage difference between the pair of electrodes.

2. The element according to claim 1, wherein the intermediate layer contains a particle including an unpaired electron.

3. The element according to claim 1, wherein the intermediate layer has rubber elasticity.

4. The element according to claim 1, wherein the intermediate layer has at least one peak at a g value between 2.004 and 1.998 when being measured by using an electron spin resonance (ESR) device.

5. The element according to claim 1, wherein the intermediate layer has at least one peak at a g value between 2.070 and 2.001 when being measured at an environment temperature of −150° C. using an electron spin resonance (ESR) device.

6. The element according to claim 1, wherein
part of the pair of electrodes includes a fixing structure making fixing while maintaining an insulation property between the electrodes, and
the fixing structure fixes the pair of electrodes such that at least one of the pair of electrodes and the intermediate layer slide on each other due to a difference in a moving distance caused by a curvature when the element is bent by external force.

7. A cell comprising:
the element according to claim 1; and
an exterior member having flexibility and covering the pair of electrodes and the intermediate layer.

8. The cell according to claim 7, further comprising:
a fixing structure fixing the exterior member and at least part of the electrodes, wherein
the fixing structure fixes the pair of electrodes and the exterior member such that at least one of the pair of electrodes and the intermediate layer slide on each other due to a difference in a moving distance caused by a curvature when the cell is bent by external force.

9. A power generation device comprising:
the cell according to claim 7; and
a rectifier circuit,
the power generation device having resilience with respect to external force.

10. The element of claim 1, wherein the pair of electrodes are conductors, and the element generates the voltage difference between the electrodes in response to the deformation, which is caused by an external force.

* * * * *